(12) United States Patent
Nakamura et al.

(10) Patent No.: US 8,952,383 B2
(45) Date of Patent: Feb. 10, 2015

(54) TEST CARRIER

(71) Applicants: Kiyoto Nakamura, Tokyo (JP); Takashi Fujisaki, Tokyo (JP)

(72) Inventors: Kiyoto Nakamura, Tokyo (JP); Takashi Fujisaki, Tokyo (JP)

(73) Assignee: Advantest Corporation, Tokyo (JP)

( * ) Notice: Subject to any disclaimer, the term of this patent is extended or adjusted under 35 U.S.C. 154(b) by 110 days.

(21) Appl. No.: 13/644,140

(22) Filed: Oct. 3, 2012

(65) Prior Publication Data

US 2013/0082259 A1 Apr. 4, 2013

(30) Foreign Application Priority Data

Oct. 4, 2011 (JP) ................................. 2011-220358

(51) Int. Cl.
*H01L 23/58* (2006.01)
*G01R 1/04* (2006.01)

(52) U.S. Cl.
CPC .............. *H01L 23/58* (2013.01); *G01R 1/0466* (2013.01); *H01L 2224/16225* (2013.01)
USPC ................... 257/48; 324/756.01; 324/756.02; 324/756.03; 324/756.05; 324/756.07

(58) Field of Classification Search
CPC ...................... H01L 21/6835; H01L 2223/5442
USPC ............. 257/48; 324/756.01, 756.02, 756.05, 324/756.07
See application file for complete search history.

(56) References Cited

U.S. PATENT DOCUMENTS

| | | | |
|---|---|---|---|
| 4,855,867 A * | 8/1989 | Gazdik et al. .................. | 361/719 |
| 5,391,923 A * | 2/1995 | Harada ........................... | 257/787 |
| 5,757,199 A | 5/1998 | Maruyama | |
| 6,433,563 B1 * | 8/2002 | Maruyama ................ | 324/754.07 |
| 6,466,046 B1 | 10/2002 | Maruyama et al. | |
| 6,603,325 B2 | 8/2003 | Maruyama et al. | |
| 6,781,395 B2 | 8/2004 | Maruyama et al. | |
| 7,489,148 B2 * | 2/2009 | Johnson .................... | 324/754.03 |
| 8,653,846 B2 | 2/2014 | Kogure et al. | |
| 2002/0030258 A1 * | 3/2002 | Fukasawa et al. ............ | 257/678 |
| 2002/0190741 A1 | 12/2002 | Maruyama et al. | |
| 2003/0197501 A1 | 10/2003 | Maruyama et al. | |

(Continued)

FOREIGN PATENT DOCUMENTS

| | | |
|---|---|---|
| JP | 7-263504 A | 10/1995 |
| JP | 2000-180469 | 6/2000 |
| TW | 201126626 | 8/2011 |
| WO | 2011/048834 | 4/2011 |

OTHER PUBLICATIONS

Japan Office action, mail date is Jul. 15, 2014.
Taiwan Office action, mail date is Jun. 9, 2014.
Korea Office action, mail date is Jul. 18, 2013.
U.S. Appl. No. 13/672,051 to Takashi Fujisaki et al., filed Nov. 8, 2012.

(Continued)

*Primary Examiner* — Asok K Sarkar
*Assistant Examiner* — Damian A Hillman
(74) *Attorney, Agent, or Firm* — Greenblum & Bernstein P.L.C.

(57) ABSTRACT

A test carrier which can suppress the occurrence of contact defects while securing positional precision of the terminals is provided. A test carrier 10 comprises: a base film 40 which has one main surface which has bumps which contact electrodes 91 of the die 90; and a cover film 70 which is laid over the base film 40, the die 90 is held between the base film 40 and the cover film 70, the base film 40 has: a first region 40*a* which has a first thickness $t_1$; and a second region 40*b* which has a second thickness $t_2$ which is thinner than the first thickness $t_1$, and the second region 40*b* faces at least a part of the edge 92 of the die 90.

6 Claims, 15 Drawing Sheets

FIG.2

(56) References Cited

U.S. PATENT DOCUMENTS

| | | |
|---|---|---|
| 2011/0089968 A1 | 4/2011 | Kogure et al. |
| 2011/0271774 A1 | 11/2011 | Nakamura et al. |
| 2012/0235699 A1* | 9/2012 | Nakamura et al. ....... 324/756.01 |
| 2012/0268156 A1 | 10/2012 | Kogure et al. |
| 2012/0268157 A1 | 10/2012 | Kogure et al. |

OTHER PUBLICATIONS

U.S. Appl. No. 13/677,355 to Kiyoto Nakamura et al., filed Nov. 15, 2012.

U.S. Appl. No. 13/677,653 to Kiyoto Nakamura et al., filed Nov. 15, 2012.

* cited by examiner (a)

TEST CARRIER

TECHNICAL FIELD

The present invention relates to a test carrier to which a die chip is temporarily mounted so as to test an integrated circuit or other electronic circuit which is formed in the die chip.

The present application claims priority based on Japanese Patent Application No. 2011-220358 of a Japanese patent application which was filed on Oct. 4, 2011. The content which was described in that application is incorporated into the present application by reference and forms part of the description of the present application.

BACKGROUND ART

Known in the art is a test carrier which comprises a contact sheet having a film made of polyimide on which contact pads and interconnect patterns are formed. The contact pads correspond to electrode patterns of a chip under test and the interconnect patterns are connected to the contact pads and are used for contact with an external test apparatus (for example, see PLT 1).

CITATIONS LIST

Patent Literature

PLT 1: Japanese Patent Publication No. 7-263504 A1

SUMMARY OF INVENTION

Technical Problem

In the above test carrier, if the film of the contact sheet is too thick, since that film is high in rigidity, the film ends up riding over the edge of the chip whereby there are the problems that the electrode patterns which are positioned near the edges and the contact pads are not electrically connected and contact defects occur.

On the other hand, if the film of the contact sheet is too thin, there is the problem that elongation of the film itself or waviness of the film due to stress at the time of formation of the interconnects causes a drop in the positional precision of the contact pads.

The problem to be solved by the present invention is to provide a test carrier which can suppress occurrence of contact defects while securing positional precision of the terminals.

Solution to Problem

[1] A test carrier according to the present invention is a test carrier comprising: a film-shaped first member which has a one main surface which has terminals which contact electrodes of an electronic device; and a second member which is laid over the first member, wherein the electronic device is held between the first member and the second member, the first member has: a first region which has a first thickness; and a second region which has a second thickness which is thinner than the first thickness, and the second region faces at least a part of the outer peripheral edge of the electronic device.

[2] In the invention, the second region may face at least a part of the outer peripheral edge near at least one of the electrodes.

[3] In the invention, the second region may face all the electrodes of the electronic device.

[4] In the invention, the second region may be formed by thinning the first member from the other main surface.

[5] In the invention, the first member may have at least: a first resin layer; and a second resin layer which is laid over the first resin layer, and the second region is formed by removing the second resin layer from the first resin layer.

[6] In the invention, the electronic device under test may be a die which is diced from a semiconductor wafer.

Advantageous Effects of Invention

In the present invention, the second region which faces a part of the outer peripheral edge of the electronic device in the first member is thinner than the first region. For this reason, the first member can be prevented from ending up riding over the outer peripheral edge of the electronic device, so occurrence of contact defects can be suppressed.

On the other hand, since the first region becomes thicker than the second region in the first member, elongation or waviness of the first member can be suppressed and positional precision of the terminals can be secured.

BRIEF DESCRIPTION OF DRAWINGS

FIG. 1 is a flow chart which shows part of the device production process in an embodiment of the present invention.

FIG. 2 is a disassembled cross-sectional view of a test carrier in an embodiment of the present invention.

FIG. 3 is a cross-sectional view of a test carrier in an embodiment of the present invention.

FIG. 4 is a disassembled cross-sectional view of a test carrier in an embodiment of the present invention.

FIG. 5 is an enlarged view of a part V of FIG. 4.

FIG. 6(a) is a plan view which shows a base member of a test carrier in an embodiment of the present invention, while FIG. 6(b) is a cross-sectional view along the line VIB-VIB of FIG. 6(a).

FIG. 7(a) is an enlarged view of a part VII of FIG. 3, while FIG. 7(b) is an enlarged view of a conventional test carrier.

FIG. 8 is a cross-sectional view which shows a modification of a base film in an embodiment of the present invention.

FIG. 9 is a plan view which shows another modification of a base film in an embodiment of the present invention.

FIG. 10 is a disassembled cross-sectional view which shows a first modification of a test carrier in an embodiment of the present invention.

FIG. 11 is a disassembled cross-sectional view which shows a second modification of a test carrier in an embodiment of the present invention.

FIG. 12 is a disassembled cross-sectional view which shows a third modification of a test carrier in an embodiment of the present invention.

FIG. 13 is a disassembled cross-sectional view which shows a fourth modification of a test carrier in an embodiment of the present invention.

FIG. 14 is a disassembled cross-sectional view which shows a fifth modification of a test carrier in an embodiment of the present invention.

FIG. 15 is a disassembled cross-sectional view which shows a sixth modification of a test carrier in an embodiment of the present invention.

DESCRIPTION OF EMBODIMENTS

Below, an embodiment of the present invention will be explained based on the drawings.

Figure 1:
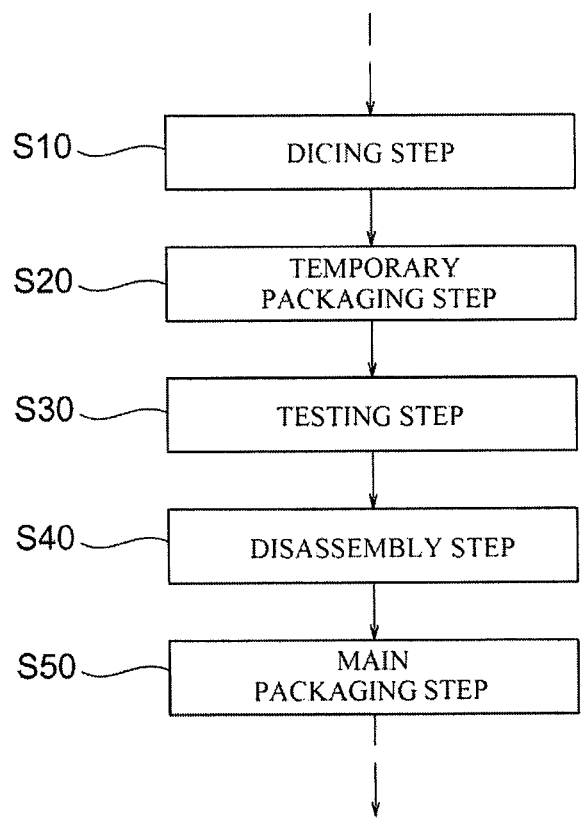
[FIG. 1]

FIG. 1 is a flow chart which shows part of a device production process in the present embodiment.

In the present embodiment, after a semiconductor wafer is diced (after step S10 of FIG. 1) and before the final packaging (before step S50), the electronic circuit which is built into the die 90 is tested (steps S20 to S40).

In the present embodiment, first, a carrier assembly apparatus (not shown) is used to temporarily mount a die 90 into a test carrier 10 (step S20). Next, through this test carrier 10, the die 90 and a test system (not shown) are electrically connected so as to test the electronic circuit which is built into the die 90 (step S30). Further, after this test is ended, the die 90 is taken out from the test carrier 10 (step S40), then this die 90 is packaged whereby the device is completed as a final product (step S50).

Below, the configuration of a test carrier into which a die 90 is temporarily mounted (temporarily packaged) in the present embodiment will be explained while referring to FIG. 2 to FIG. 15.

Figure 2:
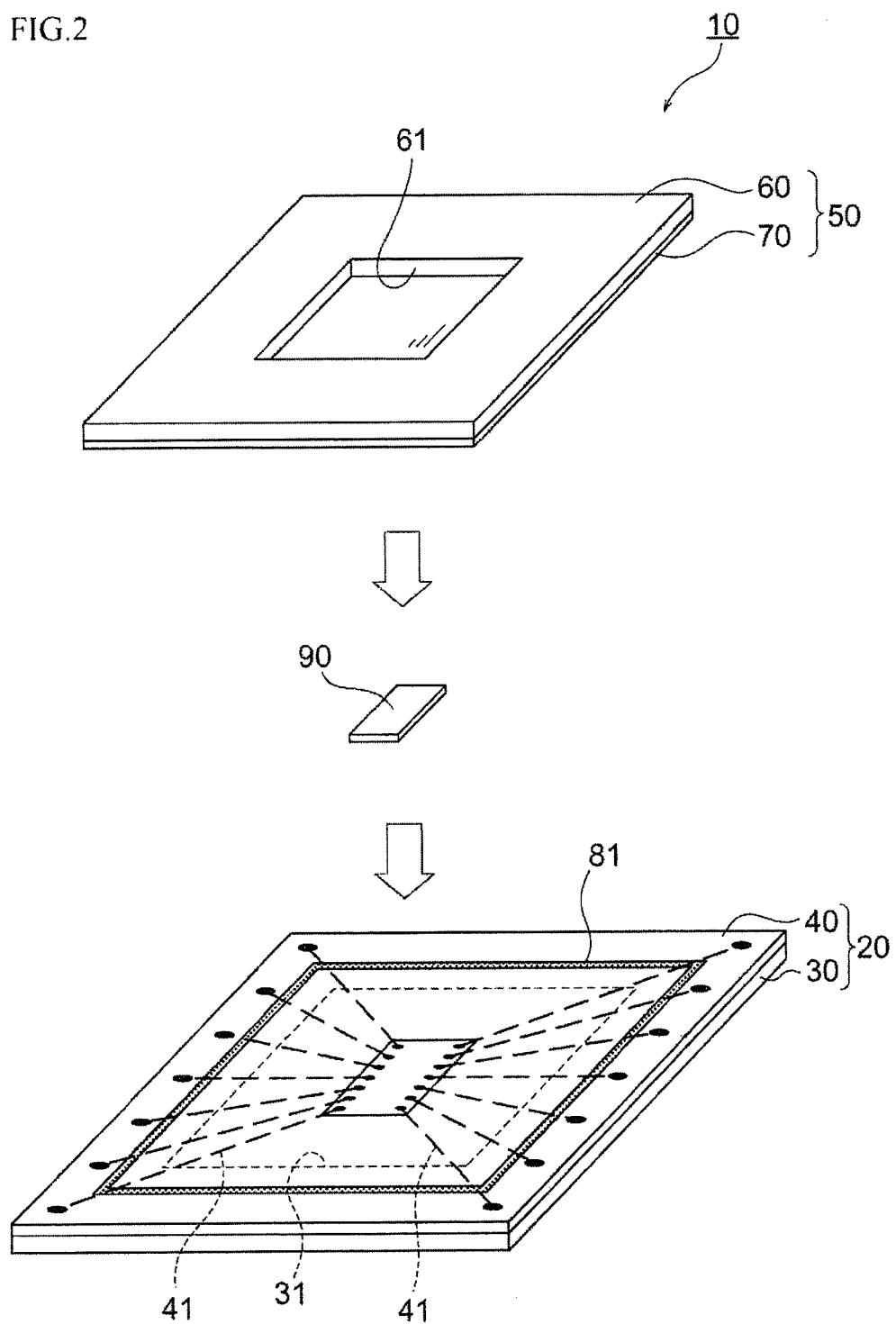
[FIG. 2]
Figure 3:
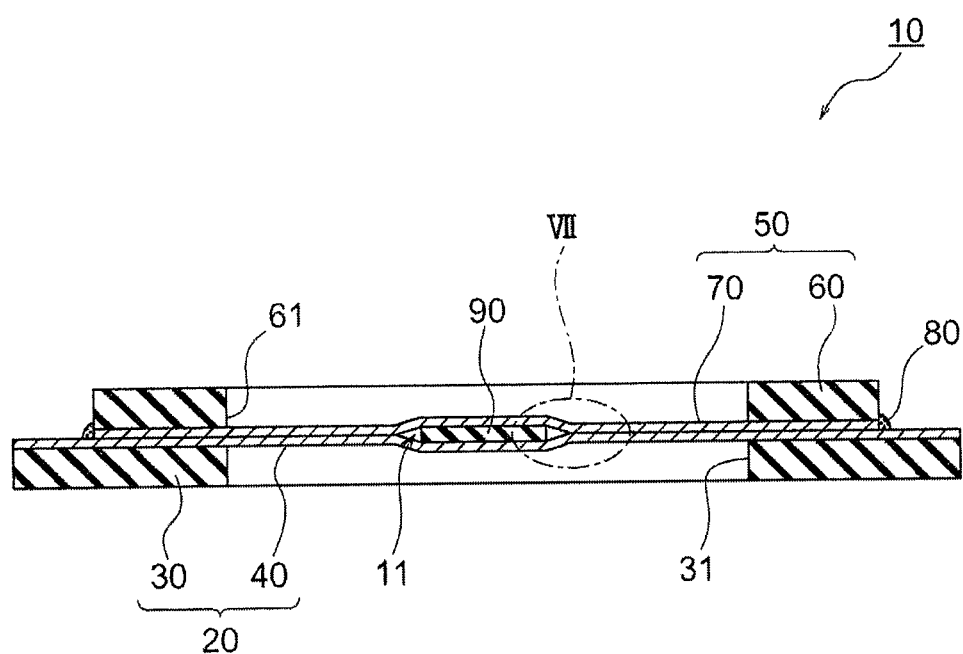
[FIG. 3]
Figure 8:
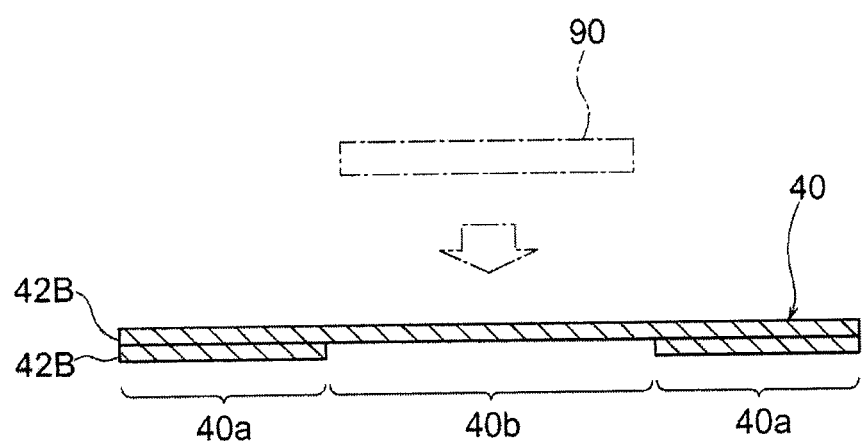
[FIG. 8]
Figure 9:
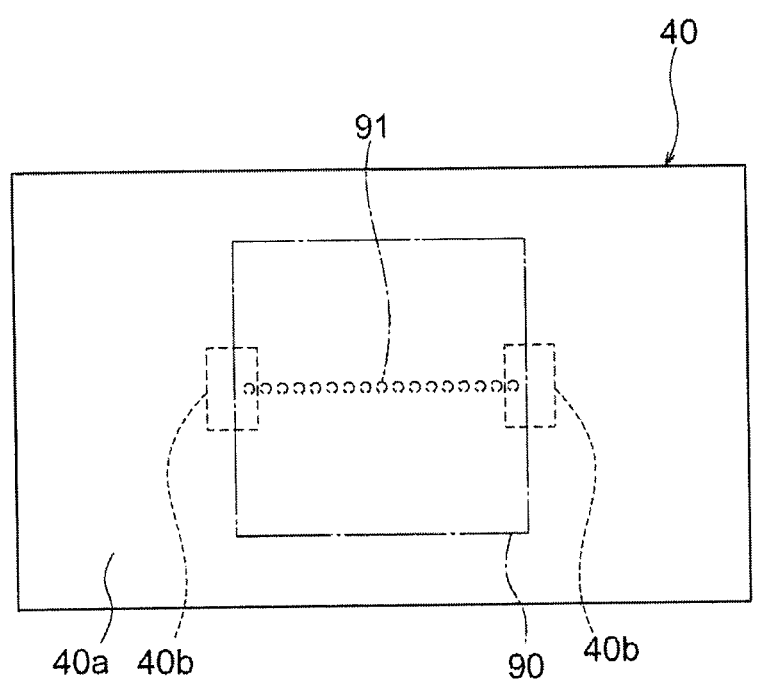
[FIG. 9]

FIG. 2 to FIG. 5 are views which show a test carrier in the present embodiment, FIG. 6(a) is a plan view which shows a base member of a test carrier in the present embodiment, FIG. 6(b) is a cross-sectional view along the line VIB-VIB of FIG. 6(a), FIG. 7(a) is an enlarged view of the part VII of FIG. 3, FIG. 7(b) is an enlarged view of a conventional test carrier, FIG. 8 and FIG. 9 are views which show modifications of a base film in the present embodiment, and FIG. 10 to FIG. 15 are cross-sectional views which show modifications of a test carrier in the present embodiment.

Figure 4:
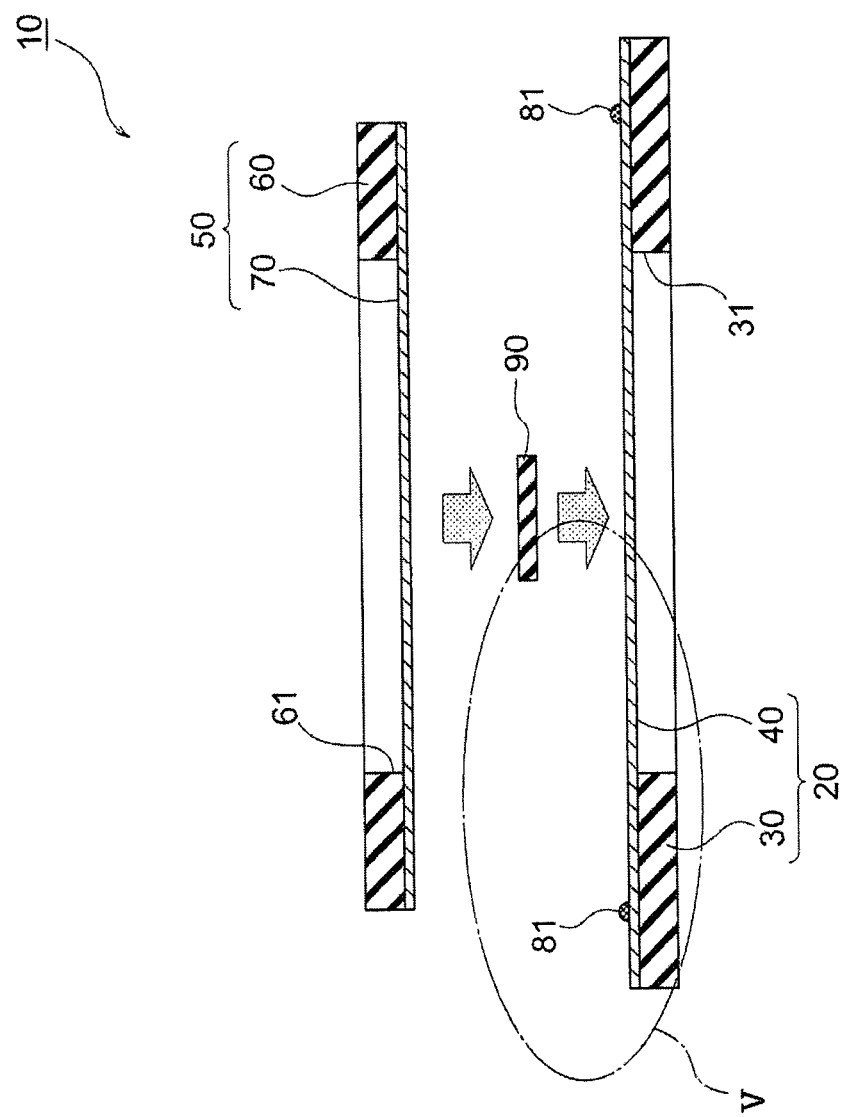
[FIG. 4]

The test carrier 10 in the present embodiment, as shown in FIG. 2 to FIG. 4, comprises: a base member 20 on which the die 90 is placed; and a cover member 50 which is covered over the base member 20. This test carrier 10 holds the die 90 between the base member 20 and the cover member 50 in a state reduced in pressure from atmospheric pressure.

The base member 20 comprises a base frame 30 and a base film 40. The base film 40 in the present embodiment is equivalent to one example of the first member in the present invention.

The base frame 30 is a rigid board which has a high rigidity (at least a rigidity higher than the base film 40 or the cover film 70) and is formed with an opening 31 at the center. As the material which forms this base frame 30, for example, a polyamide imide resin, ceramic, glass, etc. may be illustrated.

On the other hand, the base film 40 is a film which has flexibility and is attached to the entire surface of the base frame 30, including the center opening 31, through a binder (not shown). In this way, in the present embodiment, since a base frame 30 with a high rigidity is attached to the base film 40 which has flexibility, the handling ability of the base member 20 is improved. Note that, it is also possible to omit the base frame 30 and form the base member 20 by only the base film 40.

Figure 5:
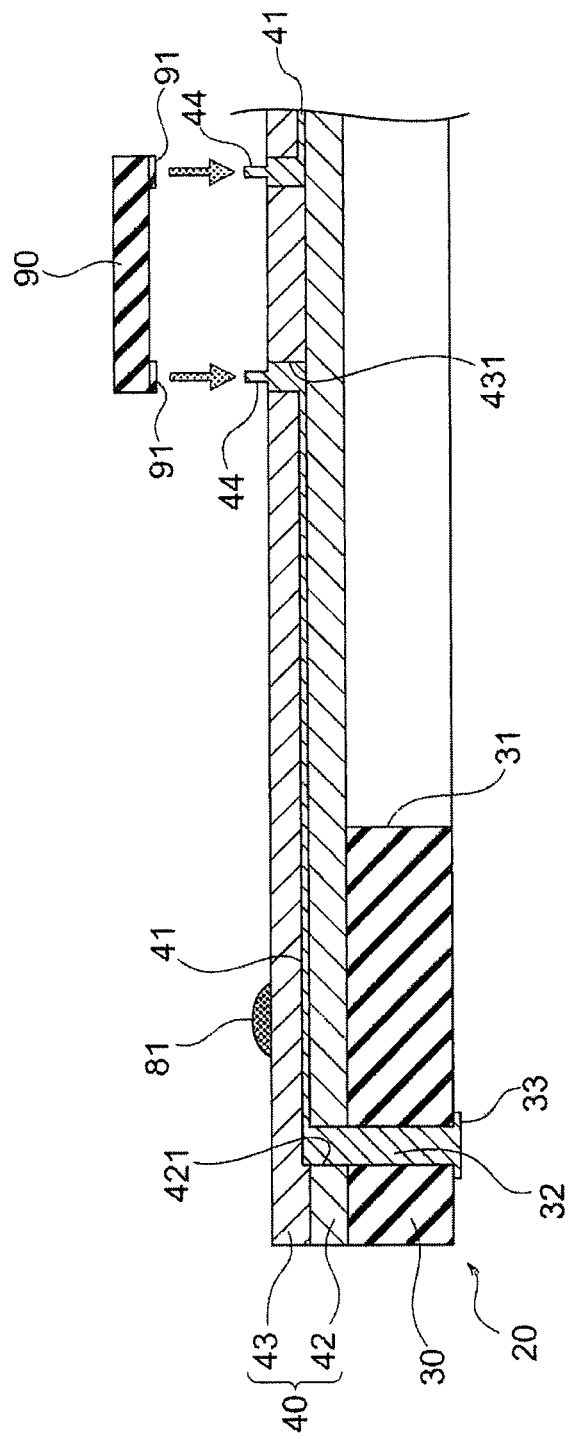
[FIG. 5]
Figure 6:
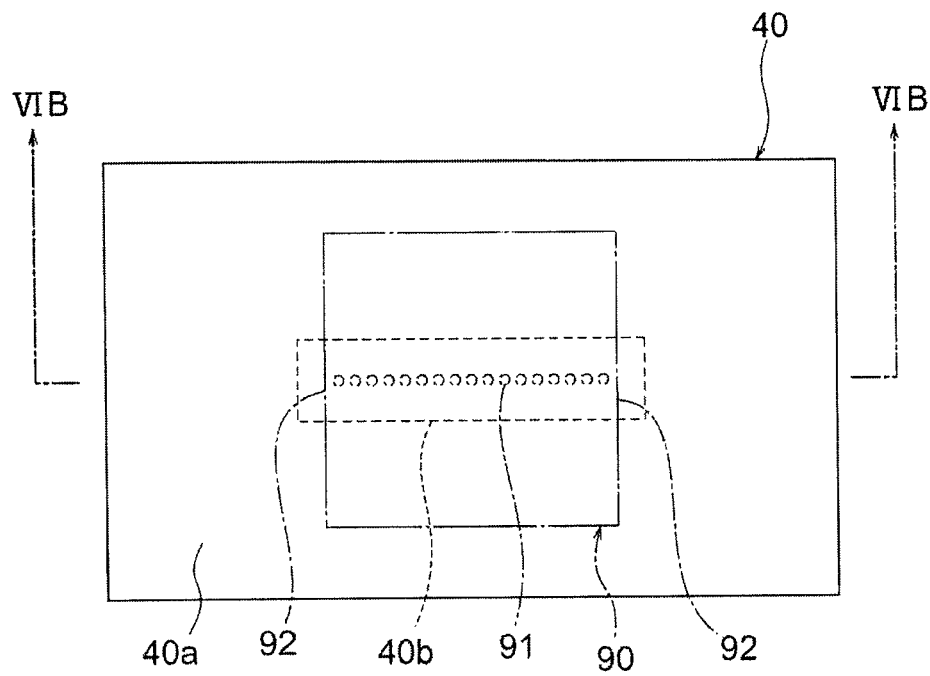
[FIG. 6]
Figure 6:
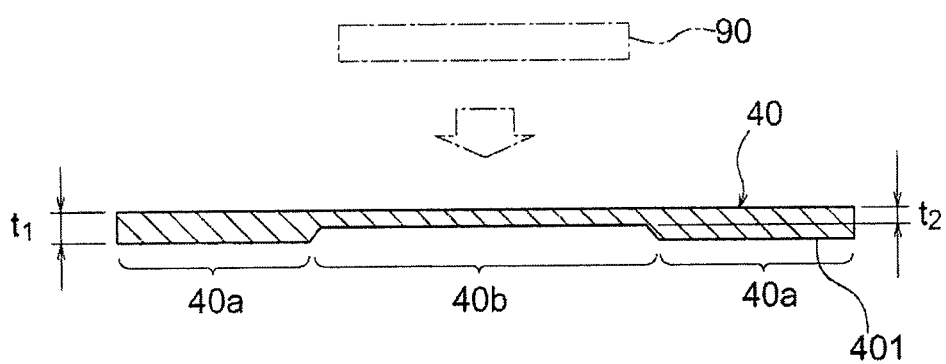
Figure 7:
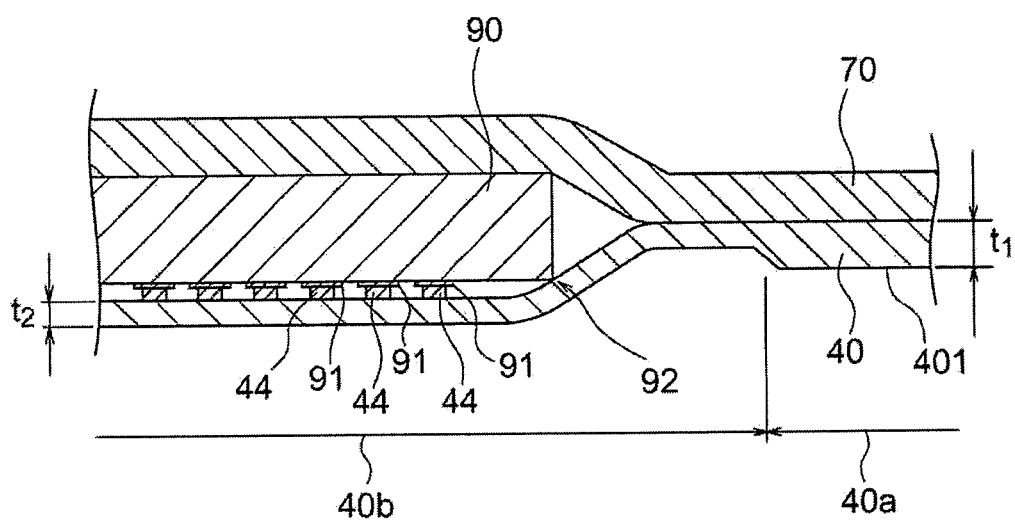
[FIG. 7]
Figure 7:
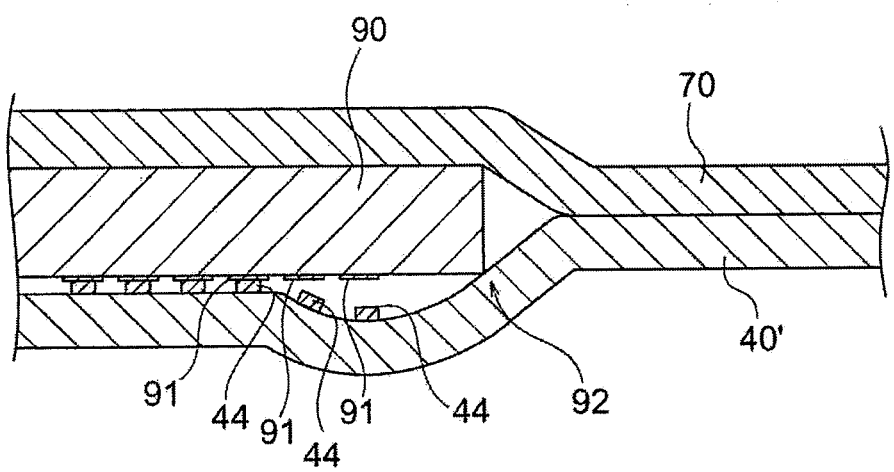

As shown in FIG. 5, this base film 40 has: a base layer 42 on which interconnect patterns 41 are formed; and a cover layer 43 which covers this base layer 42 through an adhesive layer (not shown). Both of the base layer 42 and the cover layer 43 of the base film 40 comprise, for example, polyimide films. The interconnect patterns 41 are, for example, formed by etching copper foil which is laminated on the base layer 42. Note that, the cover layer 43 may also be omitted and the interconnect patterns 41 may be exposed on the base film 40.

As shown in FIG. 5, one end of each interconnect pattern 41 is exposed through an opening 421 which is formed in the cover layer 43. A bump 44 to which an electrode pad 91 of the die 90 is to be connected is formed on it. The bump 44 is, for example, composed of copper (Cu), nickel (Ni), etc. For example, the semi-additive method is used to form it on the end part of the interconnect pattern 41. This bump 44 is arranged so as to correspond to an electrode pad 91 of the die 90.

On the other hand, the position on the base frame 30 corresponding to the other end of the interconnect pattern 41 has a through hole 32 passing through it. The interconnect pattern 41 is connected through the opening 421 which is formed in the base layer 42 to the through hole 32. This through hole 32 is connected to an external terminal 33 which is formed on the bottom surface of the base frame 30. This external terminal 33 is contacted by a contactor (not shown) of a test system when testing the electronic circuit which is built into the die 50.

Incidentally, FIG. 5 only shows two electrode pads 91, but in actuality, the die 90 is formed with a large number of electrode pads 91. On the base film 40 as well, a large number of bumps 44 are arranged so as to correspond to the electrode pads 91. The bumps 44 in the present embodiment is equivalent to one example of the terminals in the present invention. The die 90 in the present embodiment is equivalent to one example of an electronic device in the present invention, the electrode pads 91 in the present embodiment is equivalent to one example of the electrodes in the present invention, and the edge 92 of the die 90 in the present embodiment (see FIG. 7(a) etc.) is equivalent to one example of the outer peripheral edge of the electronic device in the present invention.

Note that, the interconnect patterns 41 are not limited to the above configurations. For example, while not particularly shown, part of the interconnect patterns 41 may also be formed in real time by ink jet printing on the front surface of the base film 40. Alternatively, all of the interconnect patterns 41 may be formed by ink jet printing.

In the present embodiment, as shown in FIG. 6(a) and FIG. 6(b), the base film 40 has: a first region 40a which has a first thickness $t_1$; and a second region 40b which has a second thickness $t_2$. The second thickness $t_2$ is thinner than the first thickness $t_1$ ($t_2 < t_1$).

The second region 40b of the base film 40 is formed by thinning the base film 40 from the outer surface 401 by, for example, wet etching etc. As shown in FIG. 6(a), in the plan view, the second region 40b is defined as a rectangular shape which surrounds all of the electrode pads 91 of the die 90 and a part of the edge 92 of the die 90. As opposed to this, the first region 40a is the entire region in the base film 40 other than the second region 40b. In this first region 40a, the base film 40 is not thinned. Note that, in FIG. 6(a) and FIG. 6(b), the bumps 44 and the interconnect patterns 41 are not shown.

As shown in FIG. 7(b), if the base film 40' is thick, since that base film 40' is high in rigidity, the base film 40' ends up riding over the edge 92 of the die 90 whereby part of the electrode pads 91 end up rising up. The electrode pads 91 which are positioned near the edge 92 of the die 90 and the bumps 44 are not electrically connected and contact defects occur.

As opposed to this, in the present embodiment, as shown in FIG. 7(a), the base film 40 has the second region 40b, so it is possible to prevent the base film 40 from ending up riding up over the edge 92 of the die 90 and occurrence of contact defects can be suppressed.

On the other hand, while not particularly shown, if the base film is too thin in thickness, elongation of the base film itself or waviness of the base file due to stress at the time of formation of the interconnects causes a drop in positional precision of the bumps.

As opposed to this, in the present embodiment, the base film 40 has the first region 40a, so elongation and waviness of the base film 40 can be suppressed and the positional precision of the bumps 44 can be secured.

Note that, the method of forming the second region 40b on the base film 40 is not limited to the above. For example, as shown in FIG. 8, it is also possible to make the base film 40 have a plurality of thin base layers 42B and make the numbers of the base layers 42B different so as to form the second region 40b on the base film 40. The plurality of base layers 42B in the present example are equivalent to examples of the first and second resin layers in the present invention. Note that, FIG. 8 does not show the cover layer 43.

Further, the position of the second region 40b in the base film 40 is not particularly limited. As shown in FIG. 9, in the plan view, the second region 40b need only contain the parts near the electrode pads 91 in the edge 92 of the die 90.

Returning to FIG. 2 to FIG. 4, the cover member 50 comprises a cover frame 60 and a cover film 70. The cover film 70 in the present embodiment is equivalent to one example of the second member in the present invention.

The cover frame 60 is a rigid board which has a high rigidity (at least a rigidity higher than the base film 40 and the cover film 70) and is formed with an opening 61 at the center. In the present embodiment, this cover frame 60, like the above-mentioned base frame 30, is for example composed of a polyamide imide resin, ceramic, glass, etc.

On the other hand, the cover film 70 is a film which has flexibility and is attached to the entire surface of the cover frame 60, including the center opening 61, through a binder (not shown). In the present embodiment, since a cover frame 60 with a high rigidity is attached to the cover film 70 which has flexibility, the handling ability of the cover member 50 is improved. Note that, the cover member 50 may also comprise only the cover film 70. Alternatively, the cover member 50 may also comprise only a rigid board which is not formed with the opening 61.

Note that, the positions of the bump 44 and the positions of the external terminals 33 are not limited to the above. They may also be configured such as shown in FIG. 10 to FIG. 15 which are explained below or may be configured by combinations of the same.

Figure 10:
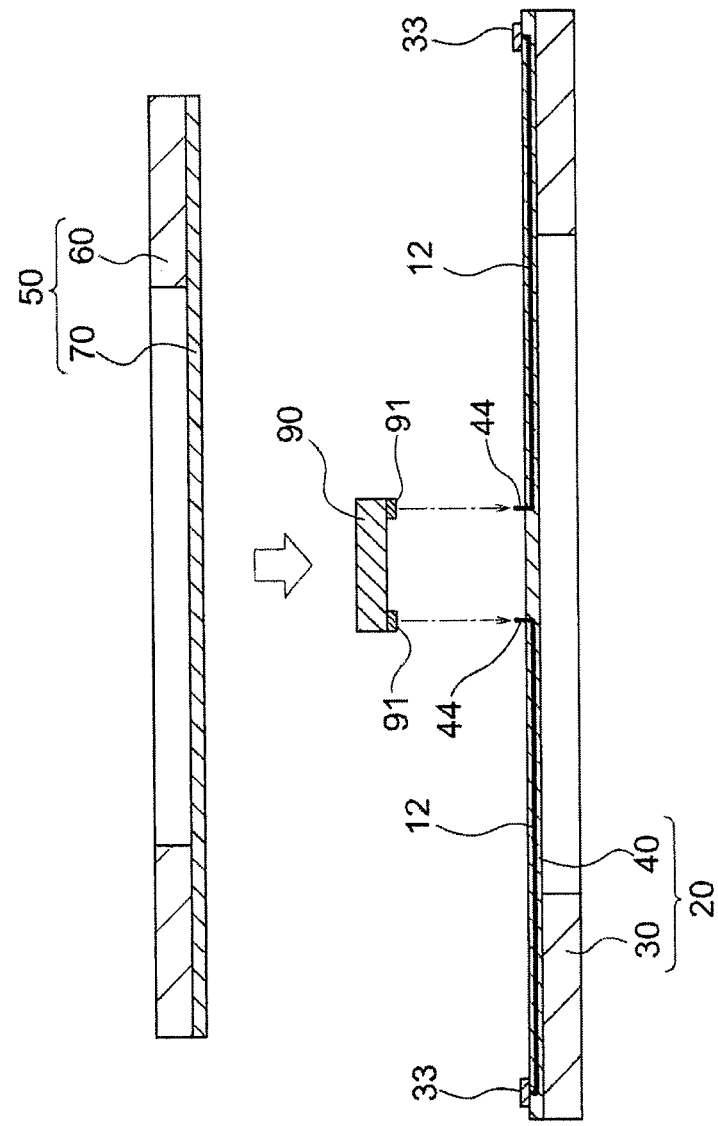
[FIG. 10]

For example, as shown by the first modification which is shown in FIG. 10, the bumps 44 and external terminals 33 may both be formed on the top surface of the base film 40. In this case, the conductive paths 12 which connect the bumps 44 and external terminals 33 are formed in only the base film 40.

Figure 11:
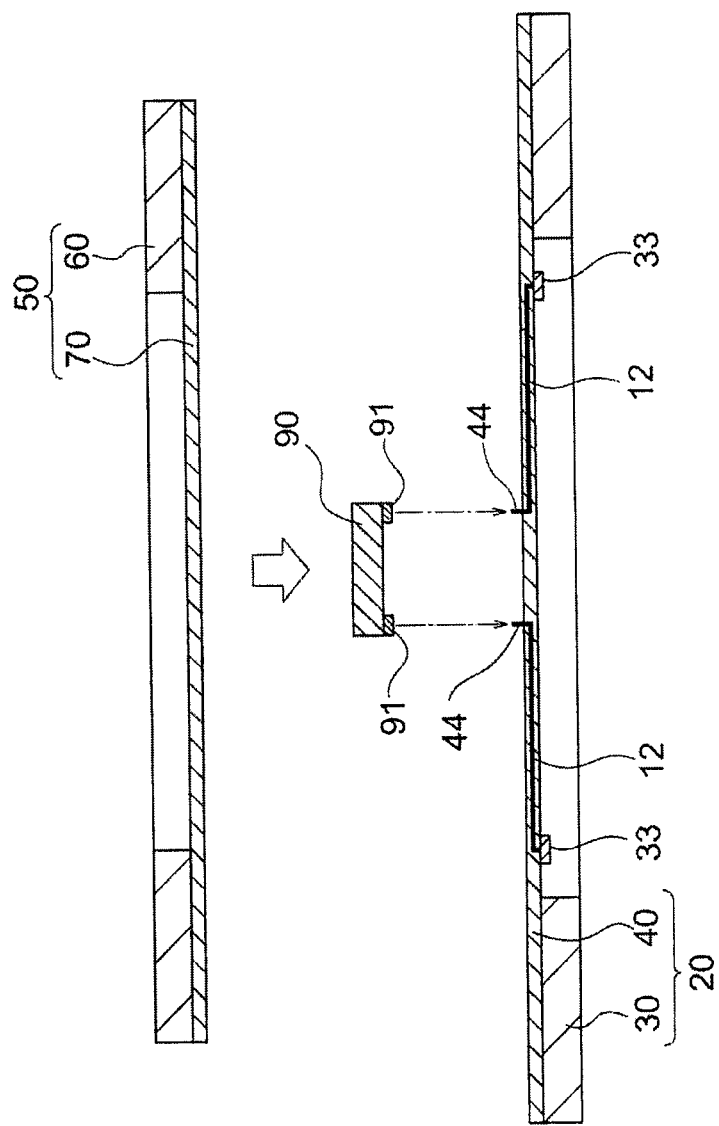
[FIG. 11]

Further, as shown by the second modification which is shown in FIG. 11, the bumps 44 may be formed on the top surface of the base film 40 and external terminals 33 may be formed on the bottom surface of the base film 40. In this case as well, the conductive paths 12 are formed in only the base film 40.

Figure 12:
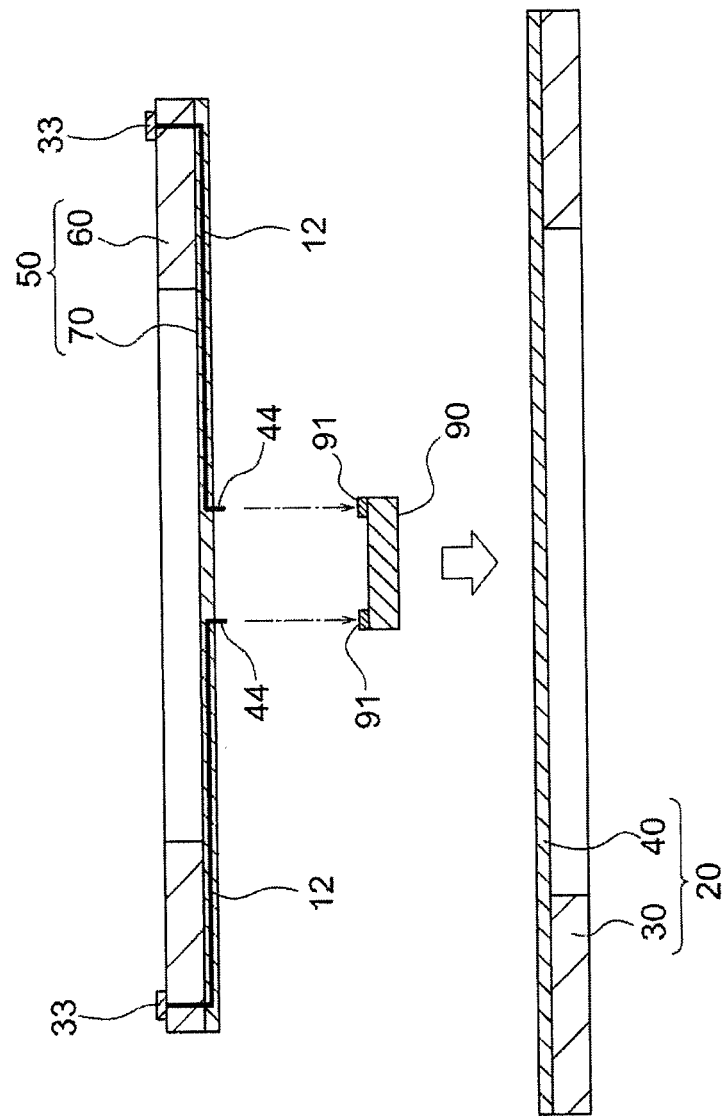
[FIG. 12]

Further, as shown by the third modification which is shown in FIG. 12, the bumps 44 may be formed on the bottom surface of the cover film 70 and the external terminals 33 may be formed on the top surface of the cover frame 60. In this case, the conductive paths 12 are formed in the cover film 70 and the cover frame 60. Note that, while not particularly shown, in the present example, the same procedure as in FIG. 10 and FIG. 11 may be used to form external terminals 33 on the bottom surface and top surface of the cover film 70.

Figure 13:
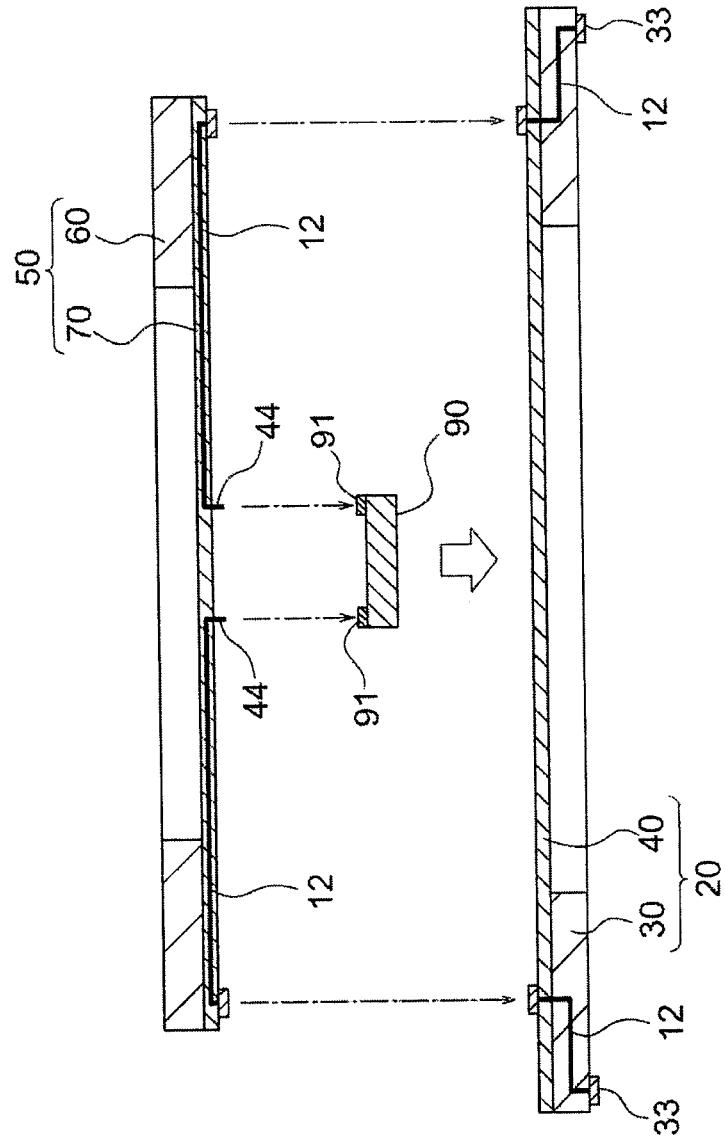
[FIG. 13]

Further, as shown by the fourth modification which is shown in FIG. 13, the bumps 44 may be formed on the bottom surface of the cover film 70 and the external terminals 33 may be formed on the bottom surface of the base frame 30. In this case, the conductive paths 12 are formed in the cover film 70, base film 40, and base frame 30.

Figure 14:
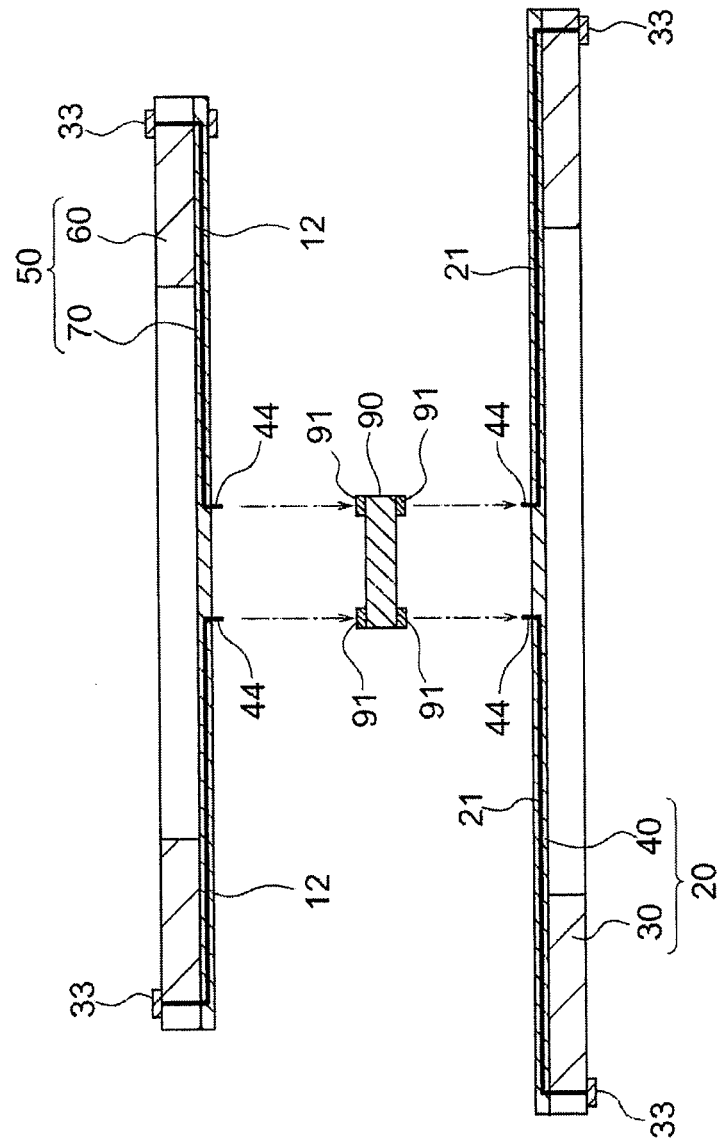
[FIG. 14]

Furthermore, when the die 90 has electrode pads 91 on both the top surface and the bottom surface, as shown in the fifth modification which is shown in FIG. 14, it is possible to form the bumps 44 on both the base film 40 and cover film 70 and the external terminals 33 on both the base frame 30 and cover frame 60.

Note that, when forming the bumps 44 on the cover film 70 in the third to fifth modifications which are shown in FIG. 12 to FIG. 14, that cover film 70 is formed with the above-mentioned first region and second region.

The above explained test carrier 10 is assembled as follows.

That is, first, in the state where the electrode pads 91 are aligned with the bumps 44, the die 90 is placed on the base file 40 of the base member 20.

Next, under an environment which is reduced in pressure compared with atmospheric pressure, the cover member 50 is laid over the base member 20 and the die 90 is interposed between the base member 20 and the cover member 50. At this time, the base film 30 of the base member 20 and the cover film 70 of the cover member 50 are made to directly contact each other by the cover member 50 being laid on the base member 20.

Figure 15:
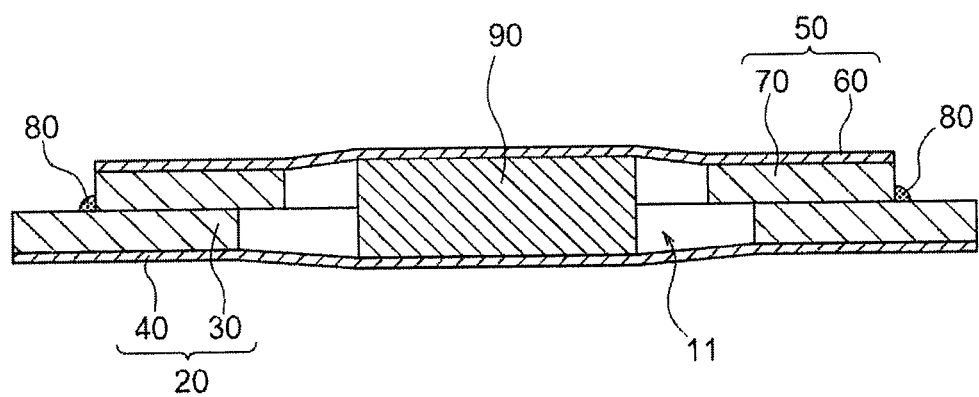
[FIG. 15]

Incidentally, if the die 90 is relatively thick, as the sixth modification which is shown in FIG. 15, the base frame 30 and the cover frame 60 may be made to directly contact by laying the cover member 50 over the base member 20.

Next, still in the state with the die 90 interposed the base member 20 and the cover member 50, the test carrier 10 is returned to an atmospheric pressure environment so that the die 90 is held in the holding space 11 (see FIG. 3) which is formed between the base member 20 and the cover member 50.

Note that, the electrode pads 91 of the die 90 and the bumps 44 of the base film 40 are not fastened by solder etc. In the present embodiment, the holding space 11 is a negative pressure compared with the atmospheric pressure, so the die 90 is pressed by the base film 40 and the cover film 70 whereby the electrode pads 91 of the die 90 and the bumps 44 of the base film 40 contact each other.

Note that, as shown in FIG. 3, the base member 20 and the cover member 50 may also be fastened to each other at the bonded part 80 so as to prevent positional deviation and improve the seal. As the binder 81 which forms this bonded part 80, for example, a UV curing type binder can be illustrated.

This binder 81, as shown in FIG. 2 and FIG. 4 to FIG. 5, is coated on the base member 20 at positions which correspond to the outer periphery of the cover member 50. The base member 20 is covered with the cover member 50, then UV rays are irradiated to cure that binder 81 whereby the bonded part 80 is formed.

Note that, when the base member 20 and the cover member 50 are bonded at the bonded part 80 and the test carrier 10 is pressed from the outside so as to bring the electrode pads 91 of the die 90 and the bumps 44 into contact, the holding space need not be reduced in pressure.

As explained above, in the present embodiment, the second region 40b can be used to prevent the base film 40 from riding up over the edge 92 of the die 90, so occurrence of contact defects can be suppressed.

Further, in the present embodiment, the first region 40a can be used to suppress occurrence of elongation or waviness of the base film 40, so positional precision of the bumps 44 can be secured.

Furthermore, in the present embodiment, the second region 40*b* faces all of the electrode pads 91 of the die 90, so warping of the die 90 and variations in height of the bumps 44 can be absorbed.

Note that, the above explained embodiment was described to facilitate understanding of the present invention and was not described for limiting the present invention. Therefore, the elements which were disclosed in the embodiment include all design changes and equivalents falling under the technical scope of the present invention.

REFERENCE SIGNS LIST

10 . . . test carrier
11 . . . holding space
12 . . . conductive path
20 . . . base member
30 . . . base frame
   31 . . . center opening
   32 . . . through holes
   33 . . . external terminals
40 . . . base film
   40*a* . . . first region
   40*b* . . . second region
   401 . . . outside surface
41 . . . interconnect patterns
42 . . . base layer
   421 . . . opening
43 . . . cover layer
   431 . . . opening
44 . . . bump
50 . . . cover member
60 . . . cover frame
   61 . . . center opening
70 . . . cover film
80 . . . bonded part
81 . . . binder
90 . . . die
91 . . . electrode pads
92 . . . edge

The invention claimed is:

1. A test carrier comprising:
a base configured to hold an electronic device, the base comprising:
a flexible base film comprising:
terminals configured to contact electrodes of the electronic device;
interconnect patterns electrically connected to the terminals; and
an electrical insulated film having a one main surface from which the terminals protrude; and
a rigid base frame attached to the flexible base film; and
a cover laid over the base, wherein:
the electronic device is configured to be interposed between the base and the cover,
the electrical insulated film has:
a first region which has a first thickness; and
a second region which has a second thickness which is thinner than the first thickness, wherein the second region faces at least a part of the outer peripheral edge of the electronic device.

2. The test carrier as set forth in claim 1, wherein the second region faces at least a part of the outer peripheral edge near at least one of the electrodes.

3. The test carrier as set forth in claim 1, wherein the second region faces all the electrodes of the electronic device.

4. The test carrier as set forth in claim 1, wherein the second region is formed by thinning the electrical insulated film from the other main surface.

5. The test carrier as set forth in claim 1, wherein the electrical insulated film has at least:
a first resin layer; and
a second resin layer which is laid over the first resin layer, and
the second region is formed by removing the second resin layer from the first resin layer.

6. The test carrier as set forth in claim 1, wherein the electronic device is a die which is diced from a semiconductor wafer.

* * * * *